US012775770B2

(12) United States Patent
Rao et al.

(10) Patent No.: US 12,775,770 B2
(45) Date of Patent: Oct. 27, 2026

(54) AUTOMATIC VERIFICATION OF HARDWARE CRYPTOGRAPHIC IMPLEMENTATIONS

(71) Applicant: INTERNATIONAL BUSINESS MACHINES CORPORATION, Armonk, NY (US)

(72) Inventors: Rajat Rao, Bangalore (IN); Arun Joseph, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 744 days.

(21) Appl. No.: 18/192,002

(22) Filed: Mar. 29, 2023

(65) Prior Publication Data

US 2024/0330552 A1 Oct. 3, 2024

(51) Int. Cl.
*G06F 30/3323* (2020.01)
*G06F 30/333* (2020.01)

(52) U.S. Cl.
CPC ........ *G06F 30/3323* (2020.01); *G06F 30/333* (2020.01)

(58) Field of Classification Search
USPC .......................................................... 716/106
See application file for complete search history.

(56) References Cited

U.S. PATENT DOCUMENTS 8,140,315 B2 * 3/2012 Walter .................... G06F 30/33 716/106
10,990,723 B2 4/2021 Kastner et al.
2013/0305194 A1 * 11/2013 Wang .................... G06F 30/398 716/52
2019/0251219 A1 8/2019 Behrend et al.
2020/0279064 A1 * 9/2020 Boutobza .............. G06F 30/337
2021/0026994 A1 * 1/2021 Tehranipoor .......... G06F 30/343
(Continued)

FOREIGN PATENT DOCUMENTS

CN 202110531 U * 1/2012
CN 113660087 A 11/2021
CN 113297073 B 7/2022
(Continued)

OTHER PUBLICATIONS

Anikeev et al., Automated Correctness Proof of Algorithm Variants in Elliptic Curve Cryptography, Modeling and Analysis of Information Systems 17(4):7-16, Project: Embedded Systems for IT Security Applications, dated Jan. 2010, 10 pages.
(Continued)

*Primary Examiner* — Mohammed Alam
(74) *Attorney, Agent, or Firm* — Onyx IP Group

(57) ABSTRACT

Automatic verification of a hardware cryptographic implementation includes receiving a reference implementation of a cryptographic algorithm, receiving test case data associated with the cryptographic algorithm, generating a stimulus based upon the test case data, applying the stimulus to the reference implementation using a simulation model to generate a first intermediate state result, applying the stimulus to a hardware implementation of the cryptographic algorithm using the simulation model to generate a second intermediate state result, and generating a verification result based upon a comparison of the first intermediate state result and the second intermediate state result.

20 Claims, 8 Drawing Sheets

(56) References Cited

U.S. PATENT DOCUMENTS

2024/0330552 A1* 10/2024 Rao .................... G06F 21/602

FOREIGN PATENT DOCUMENTS

| | | | | | |
|---|---|---|---|---|---|
| CN | 120836030 | A | | 10/2025 | |
| EP | 4689959 | A1 | | 2/2026 | |
| JP | 3427993 | B2 | * | 7/2003 | |
| WO | WO-2024199807 | A1 | * | 10/2024 | ......... G06F 30/3323 |

OTHER PUBLICATIONS

Bitat et al., Formal verification of cryptographic circuits: A semi-automatic functional approach, NISS19: Proceedings of the 2nd International Conference on Networking, Information Systems & Security, Article No. 35, URL: https://doi.org/10.1145/3320326.3320367, dated Mar. 2019, 6 pages.

Boston et al., Verified Cryptographic Code for Everybody, In: Silva, A., Leino, K.R.M. (eds) Computer Aided Verification, CAV 2021, Lecture Notes in Computer Science(), vol. 12759. Springer, Cham. URL: https://doi.org/10.1007/978-3-030-81685-8_31, Published: Jul. 15, 2021, 24 pages.

Chattopadhyay et al., Scaling Up Hardware Accelerator Verification using A-QED with Functional Decomposition, 2021 Formal Methods in Computer Aided Design (FMCAD), DOI: 10.34727/2021/isbn.978-3-85448-046-4_12, Date Added to IEEE Xplore: Nov. 28, 2021, 16 pages.

Devyani Madhukar Mirajkar, Design and Verification of a Pipelined Advanced Encryption Standard (AES) Encryption Algorithm with a 256-bit Cipher Key Using the UVM Methodology, Rochester Institute of Technology, RIT Scholar Works, URL: https://scholarworks.rit.edu/cgi/viewcontent.cgi?article=10946&context=theses, dated May 2018, 149 pages.

Erkok et al., Hardware/Software Co-verification of Cryptographic Algorithms using Cryptol, 2009 Formal Methods in Computer-Aided Design, DOI: 10.1109/FMCAD.2009.5351121, Date Added to IEEE Xplore: Dec. 11, 2009, 5 pages.

Jiang et al., Designing Secure Cryptographic Accelerators with Information Flow Enforcement: A Case Study on AES, 2019 56th ACM/IEEE Design Automation Conference (DAC), Date Added to IEEE Xplore: Aug. 22, 2019, 6 pages.

Mammo et al., AGARSoC: Automated Test and Coverage-Model Generation for Verification of Accelerator-Rich SoCs, Presentation—Dept. of Electrical Engineering and Computer Science University of Michigan, URL: https://www.aspdac.com/aspdac2017/archive/pdf/1A-1_add_file.pdf, Retrieved from internet on Nov. 8, 2022, 24 pages.

Wang et al., Verification of Implementations of Cryptographic Hash Function, IEEE Access, Special Section on Security Analytics and Intelligence for Cyber Physical Systems, vol. 5, DOI: 10.1109/ACCESS.2017.2697918, date of publication: May 10, 2017, 10 pages.

International Search Report and Written Opinion, PCT/EP2024/053691, mailed Apr. 19, 2024, 42 pages.

ISO / IEC, Information technology—Security techniques—Cryptographic algorithms and security mechanisms conformance testing, International Standard, ISO / IEC 18367, Published in Switzerland, First Edition dated: Dec. 15, 2016.

Mouha et al., Finding Bugs in Cryptographic Hash Function Implementations, IEEE Transactions on Reliability, vol. 67, Issue: 3, Sep. 2018, 10.1109/TR.2018.2847247, Date of Publication: Jul. 6, 2018, 15 pages.

Intellectual Property India, " Examination report under sections 12 & 13 of the Patents Act", Apr. 27, 2026, 7 Pages, IN Application No. 202517078393.

* cited by examiner

AUTOMATIC VERIFICATION OF HARDWARE CRYPTOGRAPHIC IMPLEMENTATIONS

BACKGROUND

Field of the Disclosure

The field of the disclosure is data processing, or, more specifically, methods, apparatus, and products for performing automatic verification of hardware cryptographic implementations.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Cryptography allows for secure communications between computing systems. The implementation of cryptographic designs in hardware has allowed for acceleration of cryptographic processes. Hardware cryptographic designs are typically implemented using electronic design automation (EDA) software tools which allow the design of integrated circuits for implementing cryptographic functions. However, cryptographic algorithms are not as easy to model as other computational operations. Cryptographic algorithms are complex multi-cycle algorithms, and it is not uncommon for implementations to run for thousands of clock cycles before generating a final result. Cryptographic designs include a data processing part and a control part. The design of the data processing part depends on the cryptographic algorithm to be implemented and PD timing/area challenges. The design of the control part has much higher dependencies on access register (AR), millicode, and other hardware units. Hardware implementations of cryptographic algorithms need to sequence the complex algorithm and is difficult to model in a verification environment to check the internal state at times. In addition, developing verification code for cryptographic features is very time intensive because it is necessary for the data and control parts to be designed to interoperate properly.

SUMMARY

Exemplary embodiments include a method, apparatus, and computer program product to perform automatic verification of a hardware cryptographic implementation. Am embodiment of a method to perform automatic verification of a hardware cryptographic implementation includes receiving a reference implementation of a cryptographic algorithm, receiving test case data associated with the cryptographic algorithm, and generating a stimulus based upon the test case data. The method further includes applying the stimulus to the reference implementation using a simulation model to generate a first intermediate state result, and applying the stimulus to a hardware implementation of the cryptographic algorithm using the simulation model to generate a second intermediate state result. The method further includes generating a verification result based upon a comparison of the first intermediate state result and the second intermediate state result.

The foregoing and other objects, features and advantages of the disclosure will be apparent from the following more particular descriptions of exemplary embodiments of the disclosure as illustrated in the accompanying drawings wherein like reference numbers generally represent like parts of exemplary embodiments of the disclosure.

DETAILED DESCRIPTION

Figure 1:
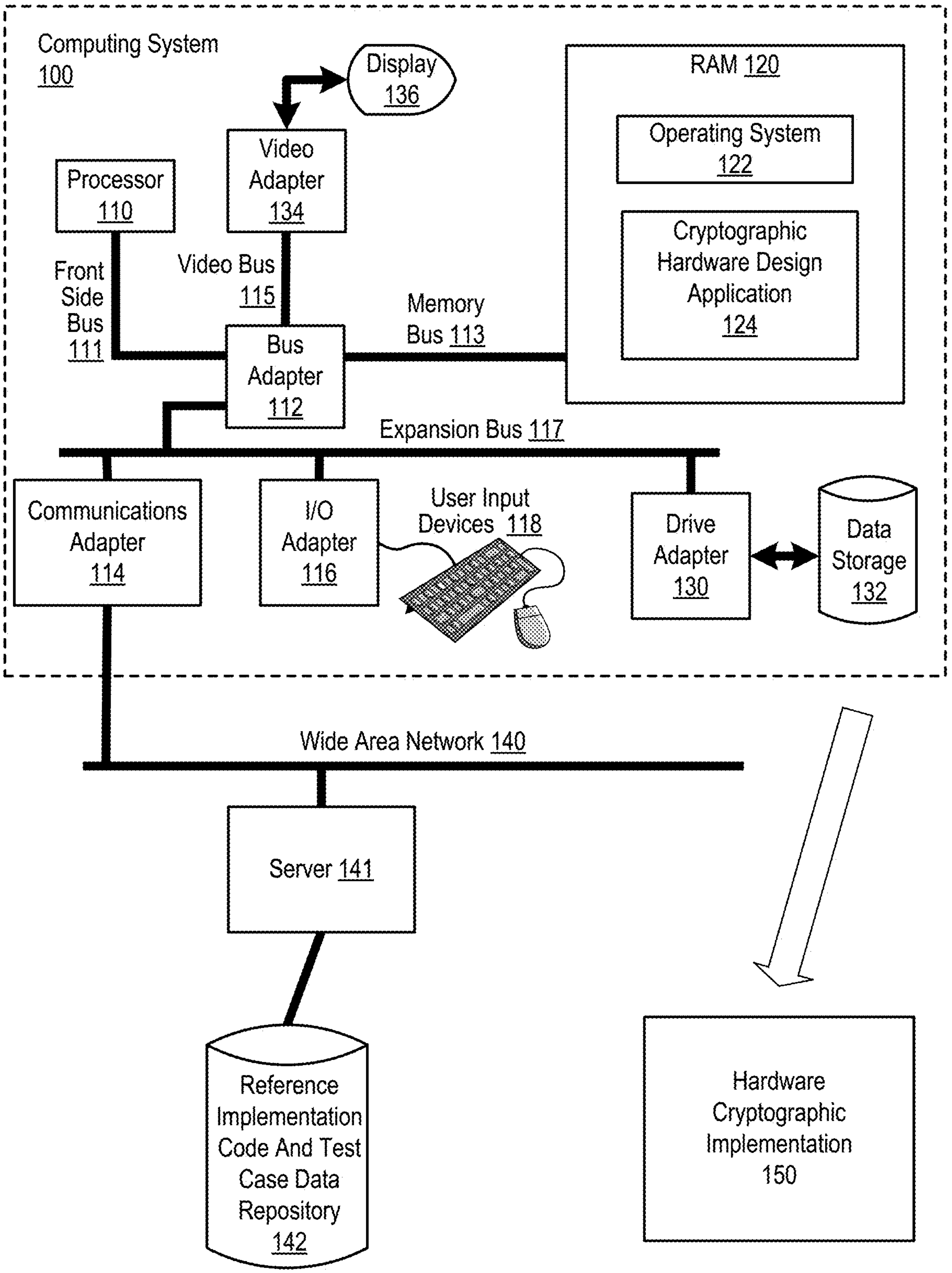
FIG. 1 shows a block diagram of an example computing system configured for automatic verification of a hardware cryptographic implementation in accordance with embodiments of the present disclosure.

Exemplary apparatus and systems for automatic verification of a hardware cryptographic implementation in accordance with the present disclosure are described with reference to the accompanying drawings, beginning with FIG. 1. FIG. 1 sets forth a block diagram of automated computing machinery comprising an exemplary computing system 100 configured for automatic verification of a hardware cryptographic implementation according to embodiments of the present disclosure. The computing system 100 of FIG. 1 includes at least one computer processor 110 or 'CPU' as well as random access memory ('RAM') 120 which is connected through a high speed memory bus 113 and bus adapter 112 to processor 110 and to other components of the computing system 100.

Stored in RAM 120 is an operating system 122. Operating systems useful in computers configured for automatic verification of a hardware cryptographic implementation according to embodiments of the present disclosure include UNIX™, Linux™, Microsoft Windows™, AIX™, and others as will occur to those of skill in the art. The operating system 122 in the example of FIG. 1 is shown in RAM 120, but many components of such software typically are stored in non-volatile memory also, such as, for example, on data storage 132, such as a disk drive. Also stored in RAM is a cryptographic hardware design application 124, including for designing and implementing cryptographic hardware such as a hardware cryptographic implementation 150 and automatic verification of the hardware cryptographic implementation 150 according to embodiments of the present disclosure. In particular embodiments, the hardware cryptographic implementation includes an integrated circuit configured to implement a cryptographic algorithm such as a cryptographic standard. In one or more embodiments, verification of the hardware cryptographic implementation 150 includes verifying that the hardware cryptographic implementation 150 correctly implements the cryptographic algorithm.

The computing system 100 of FIG. 1 includes disk drive adapter 130 coupled through expansion bus 117 and bus adapter 112 to processor 110 and other components of the computing system 100. Disk drive adapter 130 connects non-volatile data storage to the computing system 100 in the form of data storage 132. Disk drive adapters useful in computers configured for inserting sequence numbers into editable tables according to embodiments of the present disclosure include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system 100 of FIG. 1 includes one or more input/output ('I/O') adapters 116. I/O adapters implement user-oriented input/output through, for example, software drivers and computer hardware for controlling output to display devices such as computer display screens, as well as user input from user input devices 118 such as keyboards and mice. The example computing system 100 of FIG. 1 includes a video adapter 134, which is an example of an I/O adapter specially designed for graphic output to a display device 136 such as a display screen or computer monitor. Video adapter 134 is connected to processor 110 through a high speed video bus 115, bus adapter 112, and the front side bus 111, which is also a high speed bus.

The exemplary computing system 100 of FIG. 1 includes a communications adapter 114 for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for inserting sequence numbers into editable tables according to embodiments of the present disclosure include modems for wired dial-up communications, Ethernet (IEEE 802.3) adapters for wired data communications, and 802.11 adapters for wireless data communications. The communications adapter 114 of FIG. 1 is communicatively coupled to a wide area network 140 that also includes other computing devices, such as a server 141 as shown in FIG. 1. The server 141 is in communication with a reference implementation code and test case data repository 142 storing reference implementation code for implementing a particular cryptographic algorithm and test case data for testing the cryptographic algorithm for correct operation.

As previously discussed, cryptographic designs include a data processing part and a control part. The design of the data processing part depends on the cryptographic algorithm to be implemented and PD timing/area challenges. The design of the control part has much higher dependencies on access register (AR), millicode, and other hardware units. Developing verification code for cryptographic features is very time intensive because it is necessary for the data and control parts to be designed to interoperate properly. For overall verification of the hardware cryptographic implementation including various control signals, a simulation environment is used.

One or more embodiments provide for an automated too-driven framework that allows easy verification of the data path of hardware cryptographic implementations as well as an automated procedure to generate verification reference models for easy reuse and accelerated time-to-marked of the hardware cryptographic implementation. One or more embodiments, includes a two part procedure in which the first part includes data path verification and the second part includes control signal verification. In the first part of the procedure according to one or more embodiments, a user selects a cryptographic algorithm for which a reference implementation and test case data is available. In a particular embodiment, the cryptographic algorithm is a National Institute of Standards and Technology (NIST) standard. In an embodiment, an electronic design automation (EDA) tool downloads test case data associated with the cryptographic algorithm such as Known Answer Test (KAT) data and Monte Carol Test (MCT) data. The EDA tool generates a scenario/stimulus file that is auto-filled as per the cryptographic algorithm which includes looping over all of the tests of the test case data. In the embodiment, the user opens the scenario file and enters facility/signal names for the stimulus input, output and the number of cycles for computation. In the embodiment, the user runs the simulation in which the scenario file is used to provide inputs from the test case data (e.g., KAT/MCT data) and the results are automatically checked for validity. As a result, data path verification of the hardware implementation of the cryptographic algorithm is completed.

In a second part of the procedure according to an embodiment, the EDA tool imports a reference model of the cryptographic algorithm, such as provided by a reference body, and the reference model is compiles into a library file (e.g., a .so or .a file). The library file is included in the various test environments using an application programming interface (API) to perform the cryptographic operation. In an embodiment, the user selected the cryptographic algorithm to be implemented in the hardware cryptographic implementation such as an NIST standard cryptographic algorithm. The EDA tools downloads the reference implementation code, creates a wrapper file with an API to call the core functions of the reference implementation code. The EDA tool runs the test case data (e.g., KAT and MCT) on the compiled object code and verifies that the compiled object code passes the tests based on the test case data. If the compiled object code passes the tests, the EDA tool compiles the code into a library and provides an include file for reuse of the library. A verification engineer then may use the reference doc and only any modify control signals needed for testing the hardware cryptographic implementation.

Various embodiments described herein provide for a designer to provide a mapping between an internal state (e.g., data+valid) to a reference library implementation's functions/variables. This can be used to easily generate test cases with output expectations for not only the entire cryptographic operation, but also for the internal or intermediate states of the algorithm. A benefit provided by this approach is that a verification engineer can focus only on creating randomized test cases instead of spending time understanding and checking the internal state of the hardware. In addition, the designer is able to quickly determine a root cause of failure rather than back tracing a failing run to find a first point of mismatch.

Figure 2:
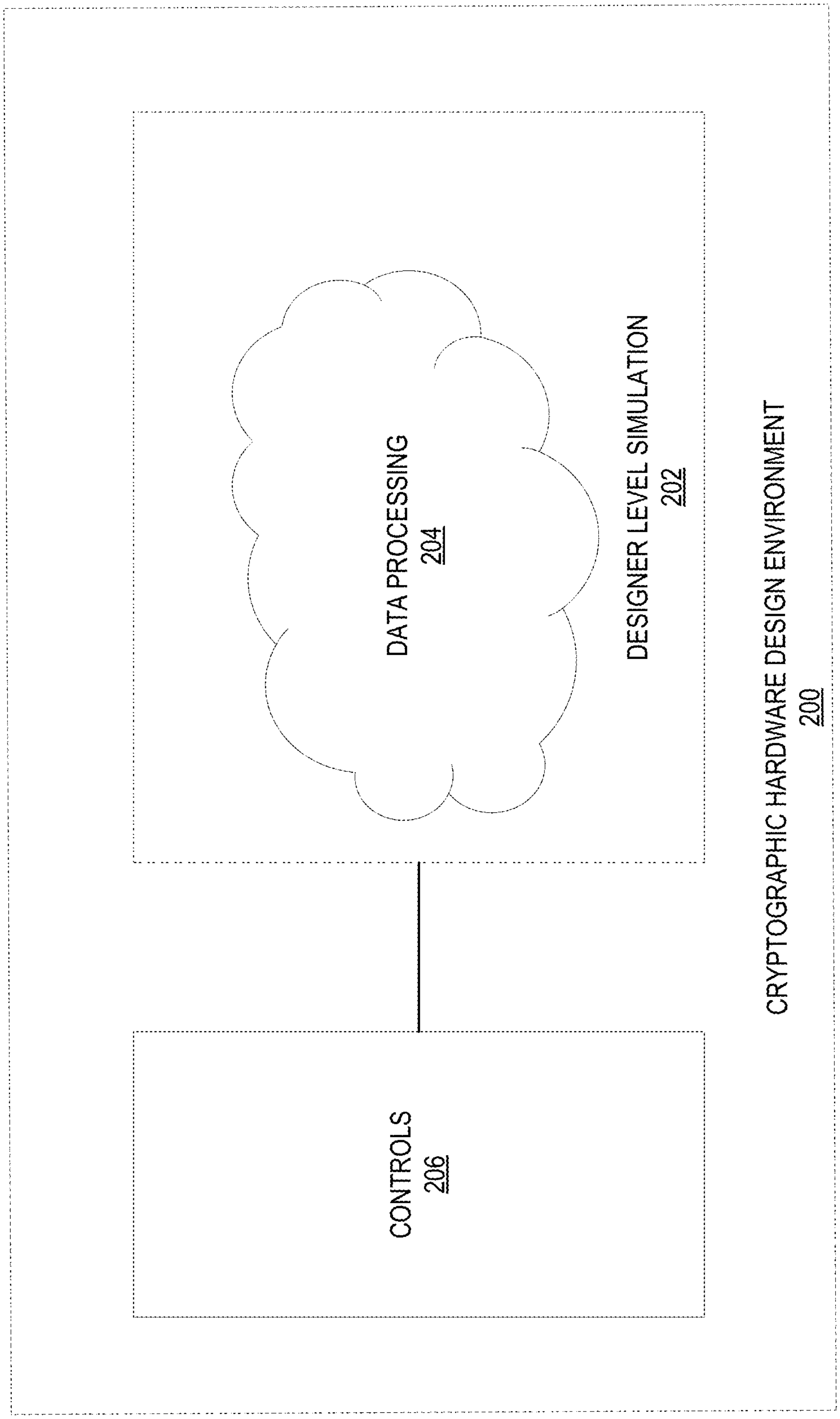
FIG. 2 shows a block diagram of a cryptographic hardware environment for automatic verification of a hardware cryptographic implementation in accordance with embodiments of the present disclosure.

FIG. 2 shows a block diagram of a cryptographic hardware design environment 200 for automatic verification of a hardware cryptographic implementation in accordance with embodiments of the present disclosure. The cryptographic hardware design environment 200 includes a design level simulation 202 including a data processing component 204. The cryptographic hardware design environment 200 includes user controls 206 for allowing a user to control aspect of the design level simulation 202. The data processing component 204 is configured to execute the functions of the design level simulation including verifying a hardware implementation of a cryptographic algorithm as described herein with respect to various embodiments. In one or more embodiments, the cryptographic hardware design environment 200 allows performing of cryptographic dataflow and perform testing with test case data such as NIST KATs and MCTs. In particular embodiments, the cryptographic hardware design environment 200 is configured to allow download of test case data (e.g., KAT/MCT), isolate the dataflow portion to test in a designer level verification framework, create design level verification scenario/stimulus from the test case data, and run tests and verify results. In particular embodiments, the creating of the scenario/stimulus and the running of the tests/verification is automatically performed for all of the test case data. In one or more embodiments, the cryptographic hardware design environment allows for control flow changes and simulations to test and stress corner cases such as large data, small data, and checkpointing.

Figure 3:
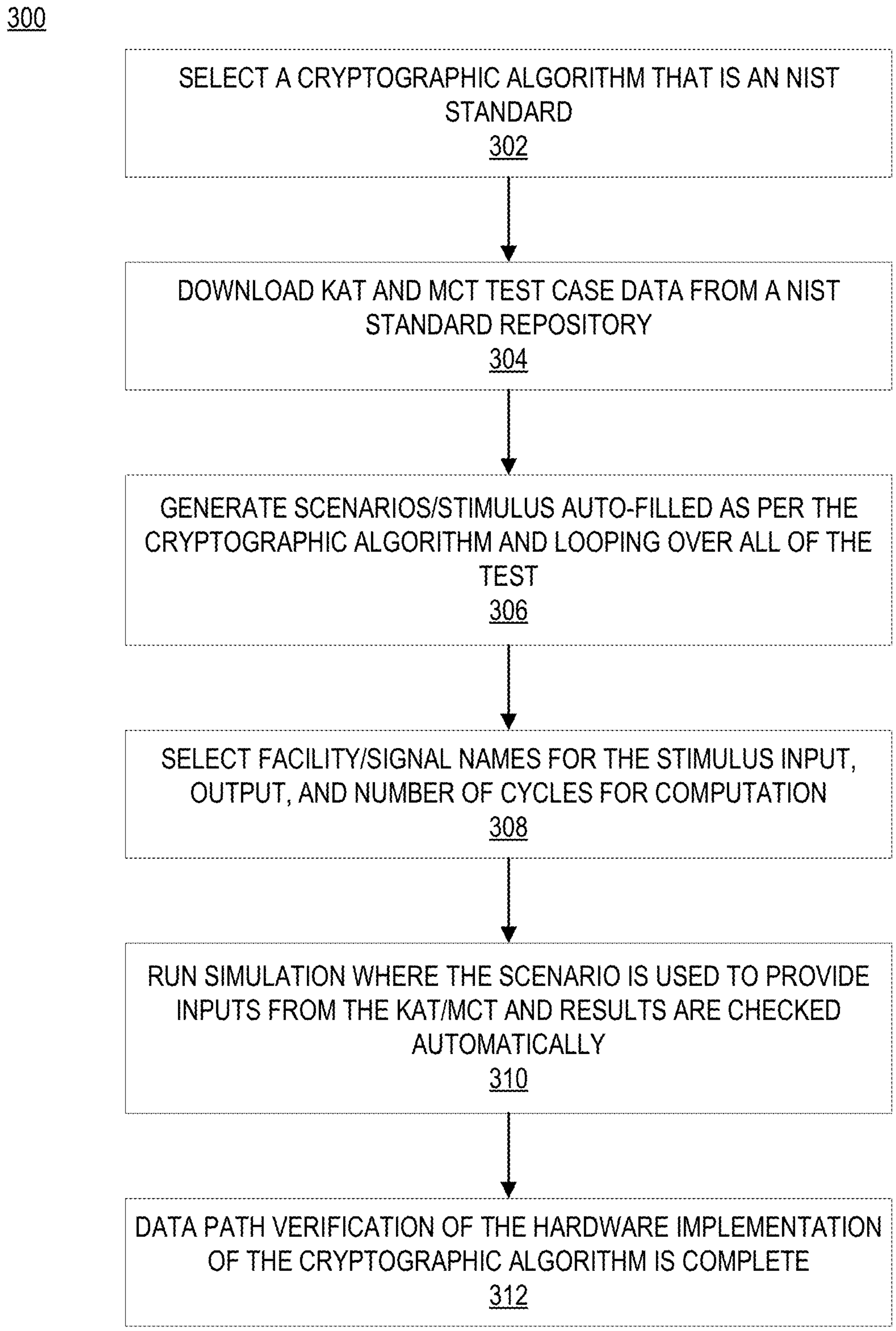
FIG. 3 is a flowchart of an example method for data path verification of a hardware cryptographic implementation according to some embodiments of the present disclosure.

For further explanation, FIG. 3 sets forth a flowchart of an example method 300 for data path verification of a hardware cryptographic implementation according to some embodiments of the present disclosure. The method 300 includes selecting 302 a cryptographic algorithm that is an NIST standard using an EDA tool, and downloading 304 KAT and MCT test case data from a NIST standard repository. The method 300 further includes generating 306 scenarios/stimulus that are auto-filled as per the cryptographic algorithm and looping the generating over all of the tests.

The method 300 further includes selecting 308 facility/signal names for the stimulus input, the stimulus output, and the number of cycles to be used from computation within the simulation. The method 300 further includes running 310 the simulation where the scenarios is used to provide inputs from the KAT/MCT test data and the results are checked automatically for validity. After confirmation of validity of the test results, data path verification of the hardware implementation of the cryptographic algorithm is complete 312.

In particular embodiments, user parameterizable configuration includes selection of the cryptographic reference code and test cases, input of valid signals, input of data signals, configuration of the ratio of input data width to operation data width for multi-cycle input, configuration of output valid signals or the number of clock cycles for the simulation operation to complete, and configuration of the output data signal. In one or more embodiments, the test case scenarios are automatically generated based on the configuration, and test cases are run to provide a result summary.

Figure 4:
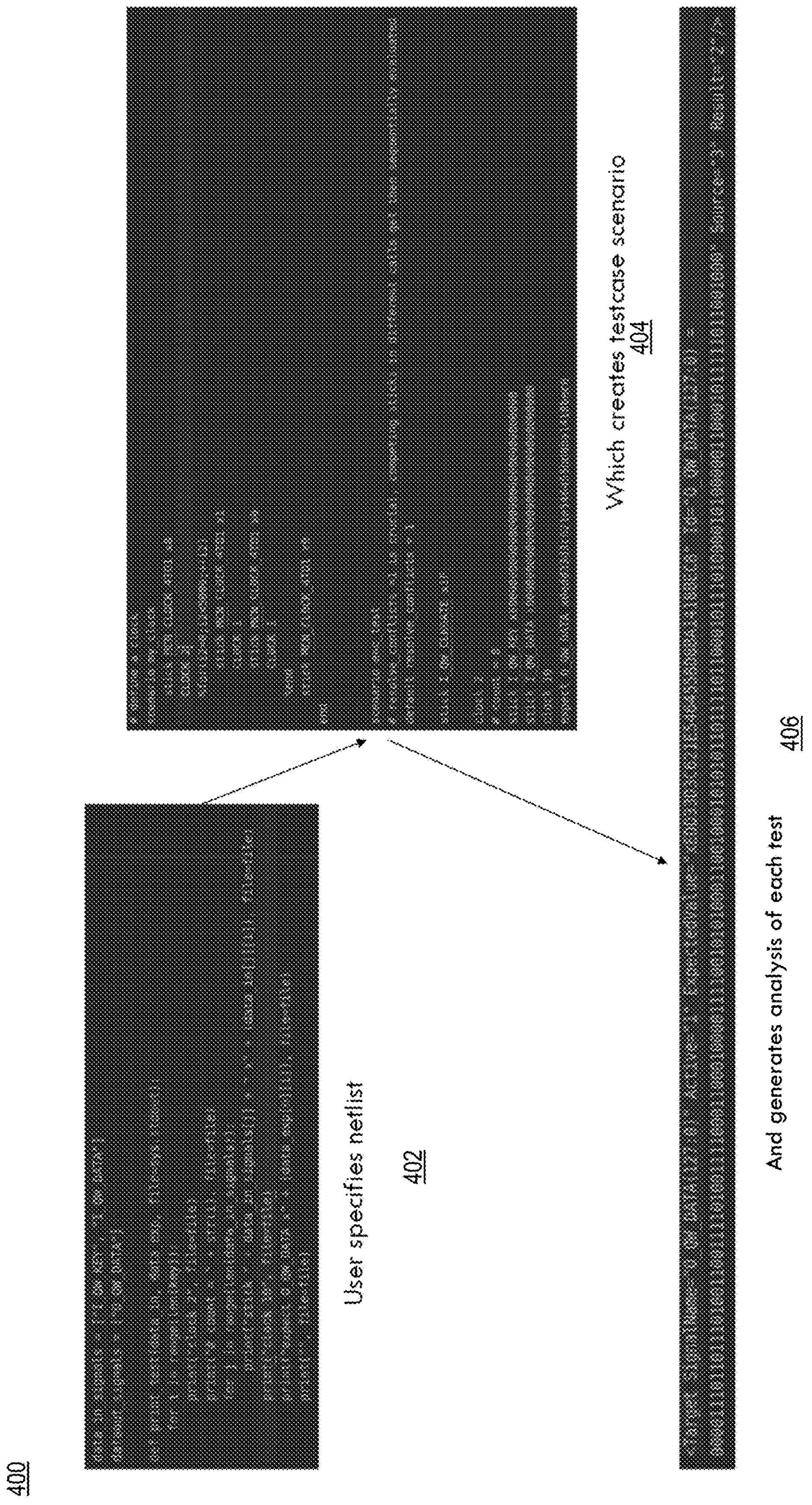
FIG. 4 shows a block diagram of an example process of data path verification of a hardware cryptographic implementation according to some embodiments of the present disclosure.

FIG. 4 shows a block diagram of an example process 400 of data path verification of a hardware cryptographic implementation according to some embodiments of the present disclosure. In an example process 400 a user specifies a netlist 402 specifying data paths of the hardware cryptographic implementation. From the netlist 402, a testcase scenario 404 is created. Once the testcase scenario 404 is run on the simulation, an analysis 406 of each test is generated.

Figure 5:
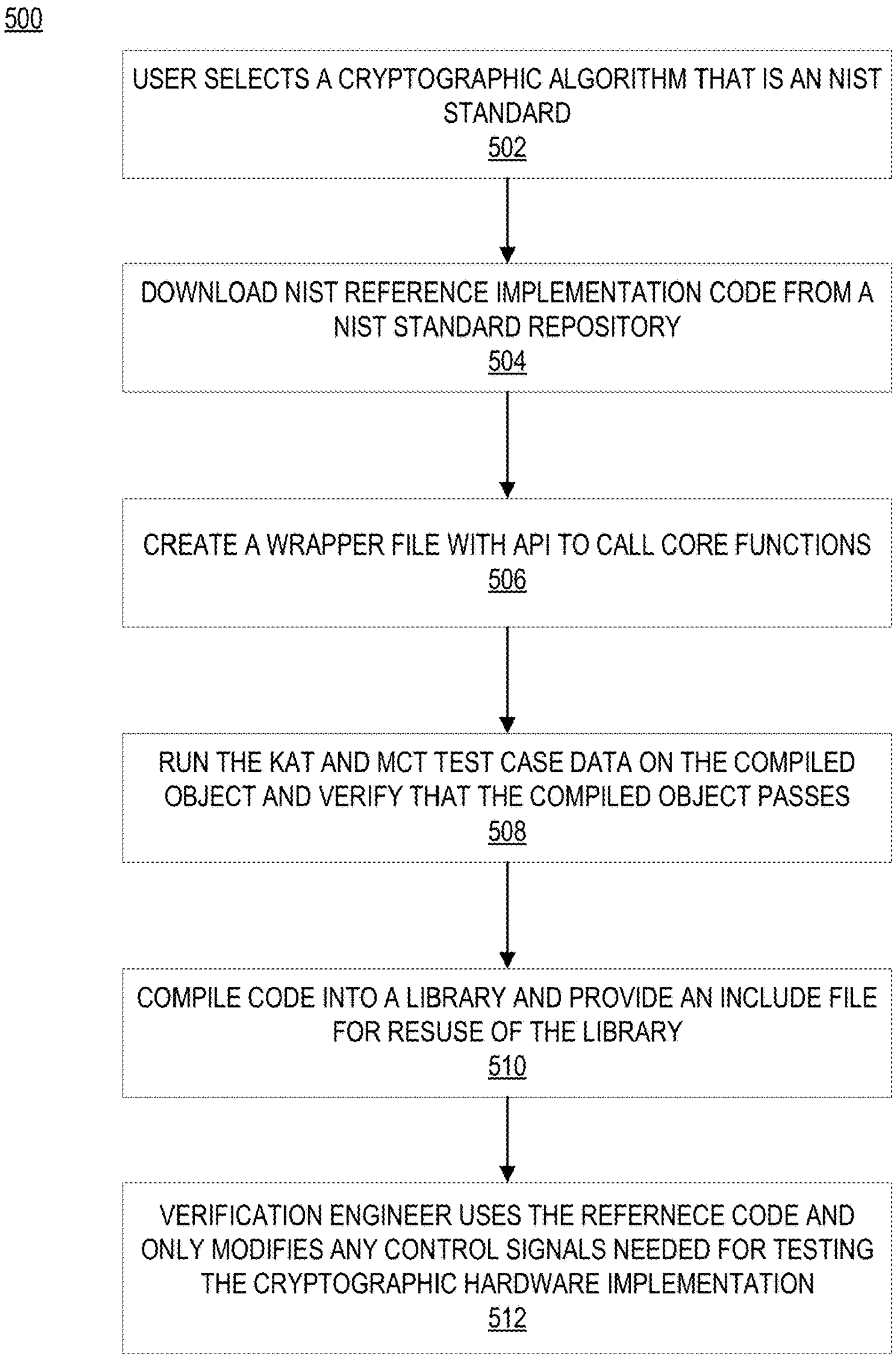
FIG. 5 is a flowchart of an example method for control signal verification of a hardware cryptographic implementation according to some embodiments of the present disclosure.

FIG. 5 sets forth a flowchart of an example method 500 for control signal verification of a hardware cryptographic implementation according to some embodiments of the present disclosure. The method 500 includes a user selecting 502 a cryptographic algorithm that is an NIST standard using an EDA tool. The EDA tool downloads 504 NIST reference implementation code for the cryptographic algorithm from an NIST standard repository.

The EDA tool then creates 506 a wrapper file with an API to call core functions of the cryptographic algorithm by compiling the reference implementation code. The EDA tool then runs 508 the KAT and MCT test case data on the compiled object and verifies that the compiled object passes the test cases. The EDA tool complies 510 the code into a library and provides an include file for reuse of the library. Accordingly, the reference model provided by the NIST standard is imported and compiled into a library file such as a .so or .a file.

A verification engineer then uses 512 the reference code and only modifies any control signals that are needed for testing the cryptographic hardware implementation. Accordingly, the library may be included in various test environments using the APIs to perform cryptographic operations to test the cryptographic hardware implementation.

Figure 6:
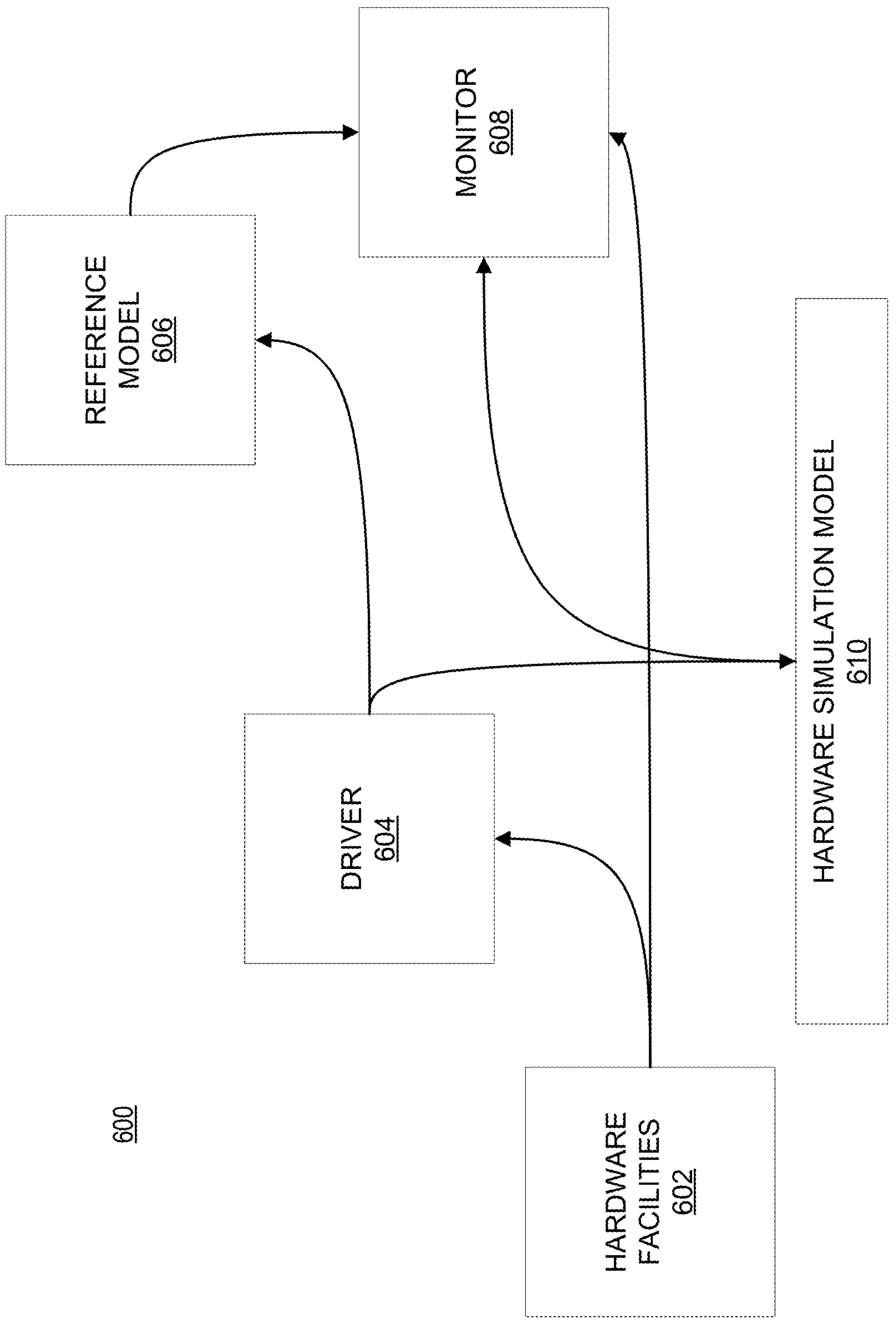
FIG. 6 sets for a block diagram of an example process flow for automatic verification of a hardware cryptographic implementation in accordance with embodiments of the present disclosure.

For further explanation, FIG. 6 sets for a block diagram of an example process flow 600 for automatic verification of a hardware cryptographic implementation in accordance with embodiments of the present disclosure. In a traditional process for verification of a hardware cryptographic implementation, a verification engineer studies the cryptographic standard in order to understand the cryptographic algorithm, studies the reference code, and integrates the reference code into a verification environment (e.g., a RTX verification environment). The verification engineer then creates a list of hardware facilities to drive randomized data into the hardware simulation model and the expected output. The verification engineer then generates randomized data and uses the reference model to compute an expected result. The verification engineer then runs test cases and analyzes the results.

In accordance the example process flow 600, a design engineer runs the EDA tool to generate test cases from a reference model 606 of the cryptographic algorithm, and the EDA tool generates a list of hardware facilities 602 that can be used in the verification environment. The EDA tool imports source code (e.g., C/C++ files) from the reference implementation into the verification environment. The EDA tool automatically generates monitor code 608 that is configured to monitor input hardware facilities being driven by a driver 604 into the reference model 606 and a hardware simulation model 610. The EDA tool installs a monitor event to compute an expected output when the input facilities is triggered. The EDA tool automatically generates monitor code that compares a reference computed result with a result observed on output facilities of the hardware simulation model 610. The verification engineer may review the automatically generated files and modify the verification environment to drive randomized data into the hardware simulation model 610. The verification engineer may then run the test cases and analyze the results to determine whether the hardware cryptographic implementation is verified.

Figure 7:
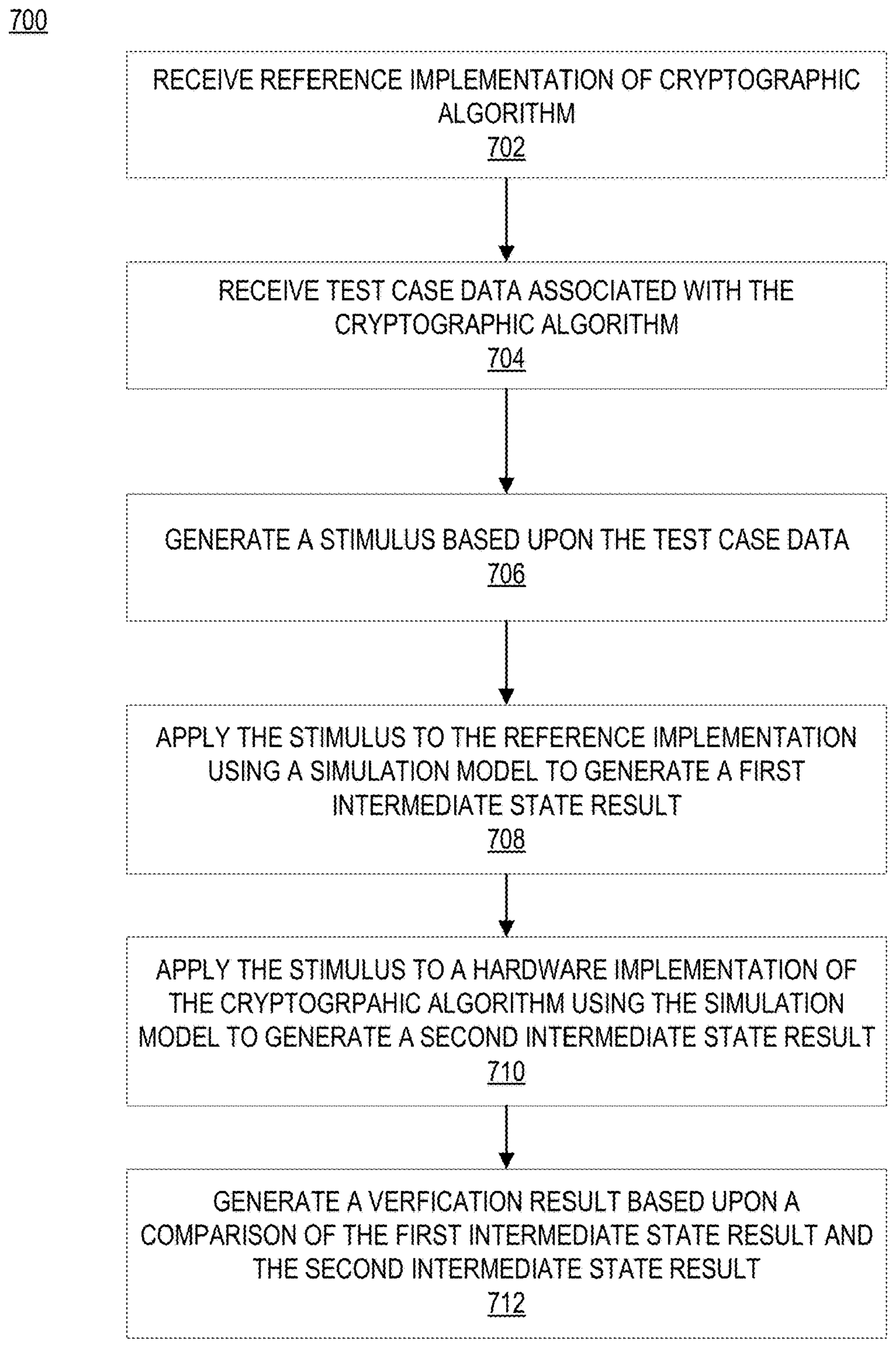
FIG. 7 is a flowchart of another example method for automatic verification of a hardware cryptographic implementation in accordance with embodiments of the present disclosure.

For further explanation, FIG. 7 sets forth a flowchart of another example method 700 for automatic verification of a hardware cryptographic implementation in accordance with embodiments of the present disclosure. The method 700 includes receiving 702 a reference implementation of a cryptographic algorithm, and receiving 704 test case data associated with the cryptographic algorithm. In a particular embodiment, the cryptographic algorithm is associated with a cryptographic standard such as an NIST standard. In a particular embodiment, the test case data includes KAT and MCT test case data. In a particular embodiment, the reference implementation of the cryptographic algorithm and the test case data are retrieved from a reference standard repository. The method further includes generating 706 a stimulus based upon the test case data.

The method 700 further includes applying 708 the stimulus to the reference implementation using a simulation model to generate a first intermediate state result, and applying 710 the stimulus to a hardware implementation of the cryptographic algorithm using the simulation model to generate a second intermediate state result. In a particular embodiment, the respective intermediate state results are output signals of intermediate states of the simulation. The method 700 further includes generating a verification result based upon a comparison of the first intermediate state result and the second intermediate state result. In particular embodiments, if the verification result determines that the first intermediate state result is substantially equivalent to the second intermediate state result, the hardware cryptographic implementation is determined to be verified.

In an embodiment, the method 700 further includes determining an expected output signal of the hardware implementation based upon the test case data and the reference implementation. In an embodiment, generating 712 the verification result is based upon occurrence of an event. In an embodiment, the event includes at least one of receiving a predetermined output signal or after a predetermined period of time has passed.

Figure 8:
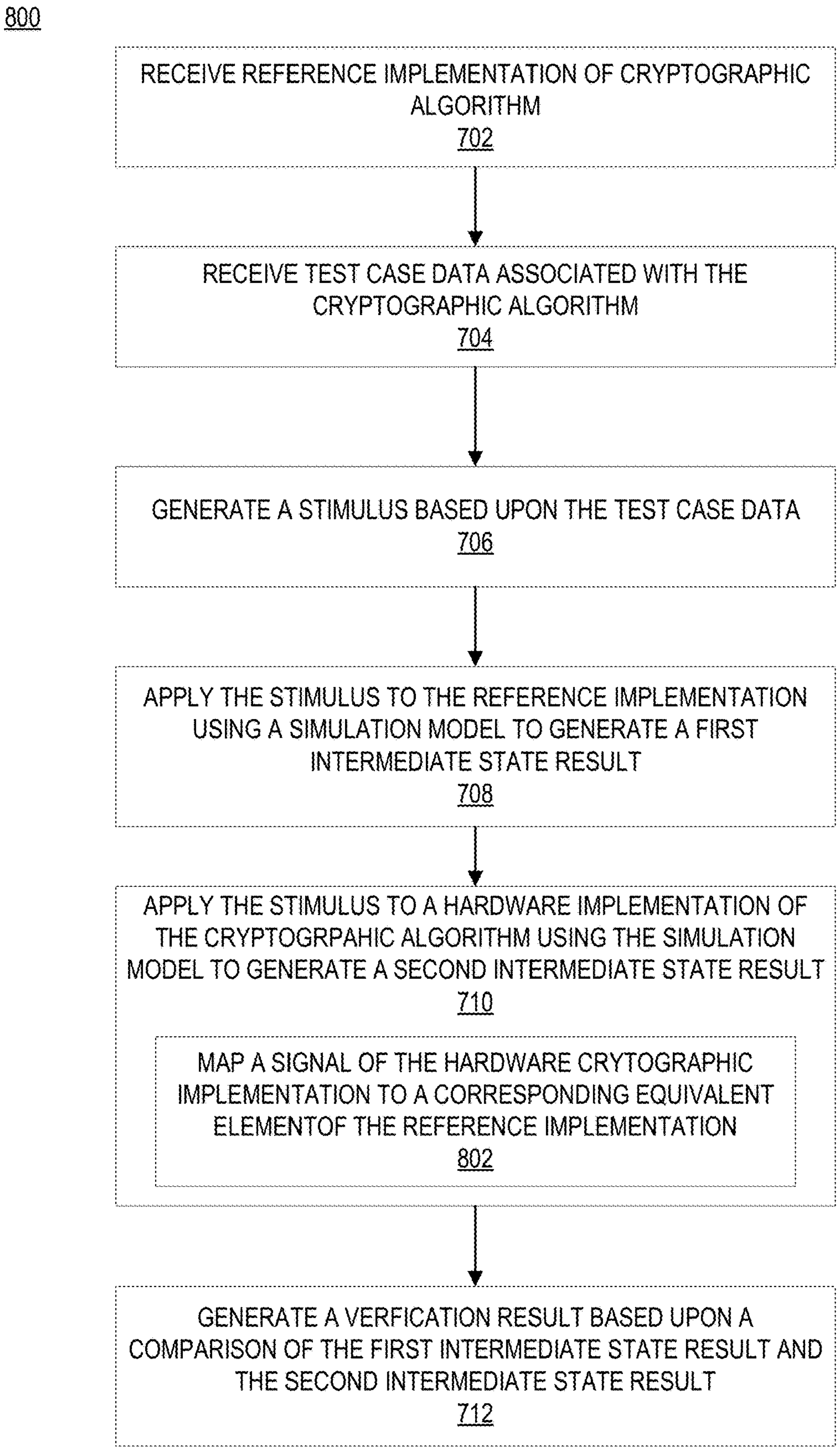
FIG. 8 is a flowchart of another example method for automatic verification of a hardware cryptographic implementation in accordance with embodiments of the present disclosure.

For further explanation, FIG. 8 sets forth a flowchart of another example method 800 for automatic verification of a hardware cryptographic implementation in accordance with embodiments of the present disclosure. The method 800 is substantially the same as the method 700 of FIG. 7 except that applying 710 the stimulus to the hardware implementation further includes mapping 802 a signal of the hardware implementation to a corresponding equivalent element of the reference implementation. In a particular embodiment, the equivalent element includes at least one of a variable or function of the reference implementation. In a particular embodiment, mapping the signal of the hardware implementation to the corresponding equivalent element of the reference implementation further includes receiving a user input specifying the mapping of the signal of the hardware implementation to the corresponding equivalent element of the reference implementation.

In view of the explanations set forth above, readers will recognize that the benefits of performing automatic verification of hardware cryptographic implementations according to embodiments of the present disclosure include:

- Reduces development and verification times for implementation of cryptographic hardware components.
- Provide for a compiled library of the cryptographic reference model to allow reuse during subsequent verification procedures.
- Reduces the amount of cryptographic algorithm knowledge required for a verification engineer to verify a cryptographic design.

Exemplary embodiments of the present disclosure are described largely in the context of a fully functional computer system for performing automatic verification of hardware cryptographic implementations. Readers of skill in the art will recognize, however, that the present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A method for automatic verification of a hardware cryptographic implementation, the method comprising:
- receiving a reference implementation of a cryptographic algorithm;
- receiving test case data associated with the cryptographic algorithm;
- generating a stimulus based upon the test case data;
- applying the stimulus to the reference implementation using a simulation model to generate a first intermediate state result;
- applying the stimulus to a hardware implementation of the cryptographic algorithm using the simulation model to generate a second intermediate state result; and
- generating a verification result based upon a comparison of the first intermediate state result and the second intermediate state result.

2. The method of claim 1, wherein applying the stimulus to the hardware implementation further comprises mapping a signal of the hardware implementation to a corresponding equivalent element of the reference implementation.

3. The method of claim 2, wherein the equivalent element comprises at least one of a variable or function of the reference implementation.

4. The method of claim 2, wherein mapping the signal of the hardware implementation to the corresponding equivalent element of the reference implementation further comprises receiving a user input specifying the mapping of the signal of the hardware implementation to the corresponding equivalent element of the reference implementation.

5. The method of claim 1, further comprising determining an expected output signal of the hardware implementation based upon the test case data and the reference implementation.

6. The method of claim 1, wherein generating the verification result is based upon occurrence of an event.

7. The method of claim 6, wherein the event includes at least one of receiving a predetermined output signal or after a predetermined period of time has passed.

8. An apparatus for automatic verification of a hardware cryptographic implementation, the apparatus comprising:

a computer processor; and a computer memory operatively coupled to the computer processor, the computer memory comprising computer program instructions that, when executed by the computer processor, cause the apparatus to:

receive a reference implementation of a cryptographic algorithm;

receive test case data associated with the cryptographic algorithm;

generate a stimulus based upon the test case data;

apply the stimulus to the reference implementation using a simulation model to generate a first intermediate state result;

apply the stimulus to a hardware implementation of the cryptographic algorithm using the simulation model to generate a second intermediate state result; and generate a verification result based upon a comparison of the first intermediate state result and the second intermediate state result.

9. The apparatus of claim 8, wherein applying the stimulus to the hardware implementation further comprises mapping a signal of the hardware implementation to a corresponding equivalent element of the reference implementation.

10. The apparatus of claim 9, wherein the equivalent element comprises at least one of a variable or function of the reference implementation.

11. The apparatus of claim 9, wherein mapping the signal of the hardware implementation to the corresponding equivalent element of the reference implementation further comprises receiving a user input specifying the mapping of the signal of the hardware implementation to the corresponding equivalent element of the reference implementation.

12. The apparatus of claim 8, wherein the computer program instructions further cause the apparatus to determine an expected output signal of the hardware implementation based upon the test case data and the reference implementation.

13. The apparatus of claim 8, wherein generating the verification result is based upon occurrence of an event.

14. The apparatus of claim 13, wherein the event includes at least one of receiving a predetermined output signal or after a predetermined period of time has passed.

15. A computer program product comprising a non-transitory computer readable medium, the computer program product comprising computer program instructions that, when executed, cause a computer to:

receive a reference implementation of a cryptographic algorithm;

receive test case data associated with the cryptographic algorithm;

generate a stimulus based upon the test case data;

apply the stimulus to the reference implementation using a simulation model to generate a first intermediate state result;

apply the stimulus to a hardware implementation of the cryptographic algorithm using the simulation model to generate a second intermediate state result; and generate a verification result based upon a comparison of the first intermediate state result and the second intermediate state result.

16. The computer program product of claim 15, wherein applying the stimulus to the hardware implementation further comprises mapping a signal of the hardware implementation to a corresponding equivalent element of the reference implementation.

17. The computer program product of claim 16, wherein the equivalent element comprises at least one of a variable or function of the reference implementation.

18. The computer program product of claim 16, wherein mapping the signal of the hardware implementation to the corresponding equivalent element of the reference implementation further comprises receiving a user input specifying the mapping of the signal of the hardware implementation to the corresponding equivalent element of the reference implementation.

19. The computer program product of claim 15, wherein the computer program instructions further cause the computer to determine an expected output signal of the hardware implementation based upon the test case data and the reference implementation.

20. The computer program product of claim 15, wherein generating the verification result is based upon occurrence of an event, and wherein the reference implementation comprises a software implementation of the cryptographic algorithm.

* * * * *